(12) United States Patent
Colby et al.

(10) Patent No.: US 9,124,415 B2
(45) Date of Patent: Sep. 1, 2015

(54) PLL GLITCHLESS PHASE ADJUSTMENT SYSTEM

(71) Applicant: Microsemi Semiconductor ULC, Kanata (CA)

(72) Inventors: David Colby, Austin, TX (US); Joep De Rijk, Rotterdam (NL); Paul H. L. M. Schram, Bergen op Zoom (NL); Tanmay Zargar, Austin, TX (US)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 14/596,300

(22) Filed: Jan. 14, 2015

(65) Prior Publication Data
US 2015/0207620 A1    Jul. 23, 2015

Related U.S. Application Data

(60) Provisional application No. 61/928,609, filed on Jan. 17, 2014.

(51) Int. Cl.
*H03D 3/24* (2006.01)
*H04L 7/033* (2006.01)

(52) U.S. Cl.
CPC .................................. *H04L 7/0331* (2013.01)

(58) Field of Classification Search
USPC .......... 375/376, 294, 327, 373; 455/103, 127; 327/156
See application file for complete search history.

(56) References Cited

U.S. PATENT DOCUMENTS

2002/0145456 A1* 10/2002 Kikuchi ........................ 327/156
2010/0045395 A1*  2/2010 Fu et al. ........................ 331/179

\* cited by examiner

*Primary Examiner* — Khai Tran
(74) *Attorney, Agent, or Firm* — Simon Kahn

(57) ABSTRACT

A clock generator with glitchless phase adjustment having a phase locked loop with a controlled oscillator providing an output representing a phase value. One or more output modules generate one or more output clocks from the output. One or more adjustment modules add a requested phase adjustment to an output clock. The phase adjustment modules are configured to break the requested phase adjustment into smaller increments and apply the increments to an output clock generated in said at the output modules one cycle at a time.

20 Claims, 5 Drawing Sheets

PLL GLITCHLESS PHASE ADJUSTMENT SYSTEM

CROSS REFERENCE TO RELATED APPLICATION

This application claims the benefit under 35 USC 119 (e) of U.S. provisional application No. 61/928,609 filed Jan. 17, 2014, the contents of which are herein incorporated by reference.

FIELD OF THE INVENTION

This invention relates to the field of digital signal synchronization, and in particular a clock generator that is capable of instantaneous, glitchless phase adjustment of the output clock derived from a phase locked loop (PLL).

BACKGROUND OF THE INVENTION

In digital electronics, there are systems that require a digital clock output signal to be frequency-locked to a reference clock source, and further require the phase alignment of the output clock to be occasionally adjusted without otherwise impacting the frequency synchronization with the reference. Additionally, other digital systems require two or more clock signals to be frequency-locked to a common reference. A clock and frame-sync pair is a common example as shown in FIG. 1. In such a system scenarios can arise where one of these clocks requires a one-time phase adjustment without otherwise impacting the frequency synchronization of either clock signal. After the clock and frame-sync have frequency-locked to the input reference, the frame-sync may also need to be phase aligned with a second signal, such as a time-of-day (ToD) seconds indicator.

In many applications, such as the ones described above, industry standards or other practical reasons exist that require the phase alignment to be glitchless, i.e. occurring without a sudden phase jump. Making an adjustment glitchless may involve limiting the size of the phase movement per clock cycle. Additionally, there may be requirements that limit when the phase adjustments are allowed. For instance, in the previous example, the phase adjustment is typically not desired during the high portion of the signal. The exact parameters defining the allowable rate and position of a glitchless phase adjustment are application specific, so it is desirable that the phase adjustment mechanism be flexible in this regard.

A variety of methods have been used to address these requirements. One such method, shown in FIG. 2, involves momentarily adjusting the Frequency Control input to a Numerically Controlled Oscillator (NCO), Digitally Controlled Oscillator (DCO), or a Voltage Controlled Oscillator (VCO). These devices allow the frequency of an output clock to be adjusted by changing a control input to the device. To perform a phase adjustment, the frequency is momentarily increased or decreased until the desired phase movement has been achieved. The disadvantages of this approach are that it cannot instantaneously apply an arbitrarily large phase step, the phase step cannot be easily timed within the high or the low portion of the clock, and it requires time sensitive control via the controller logic.

Another method involves adjusting the phase error as seen by the input to a standard PLL. During the steady-state locked condition of a PLL, the input phase error to the PLL (the difference between the input reference and the fed back signal from the PLL output) is at or near zero. To accomplish a phase adjustment, a constant phase offset (in the amount of the desired phase step) can be summed into the PLL's phase error input. This will cause the PLL to lock to the input reference, shifted by the desired phase adjustment. As shown in FIG. 3, there are three points in the input side of the PLL where the phase may be added: 1) as an offset to the input reference phase, 2) as an offset to the PLL feedback phase, and 3) as an offset to the output of the phase detector. This method is easier to control as it less time sensitive on the controller, but still cannot be an instantaneous adjustment, as the output movement is limited by the PLL's loop bandwidth. Additionally, in the case of a PLL synchronizing multiple output clocks, this solution precludes the ability to shift one of the outputs independently of the others.

The last mechanism, shown in FIG. 4, involves summing a phase offset directly into the output. In this method, a Digital PLL (DPLL) and some number of clock synthesizers are driven from the same master clock reference (which can be distinct from the input reference clock). The DPLL's output frequency and phase information are used to program the clock synthesizers to generate the final derived clock that is synchronized with the DPLL's input reference. To accomplish a phase adjustment, a one-time phase offset is summed into the desired synthesizer's phase input. While this method is fast and requires little controller logic support, it can introduce large, uncontrolled, instantaneous phase steps into the output signal.

SUMMARY OF THE INVENTION

Embodiments of the present invention solve the aforementioned problems by coordinating the phase adjustment with the output dividers of the PLL. This flexible solution allows phase adjustments to occur at any rate and at any point during the output cycle, as required by various market standards requirements. Further, the phase adjustments can be independently or selectively applied to some or all of the output clocks, without otherwise affecting the frequency lock of the PLL. Lastly, the phase adjustments can be synchronously applied to multiple outputs or a PLL.

According to the present invention there is provided a clock generator with glitchless phase adjustment, comprising a phase locked loop including a controlled oscillator providing an output representing a phase value; at least one output module for generating one or more output clocks from said output; and at least one phase adjustment module for adding a requested phase adjustment to said at least one output module, said at least one phase adjustment module being configured to break said requested phase adjustment into smaller increments and apply said increments to an output clock generated in said at least one output module one cycle at a time.

The phase adjustment may be selectively applied at a precisely time instant during either the low portion or the high portion of the cycle.

There is one instance of the phase adjustment module per output divider. Each phase adjustment module performs momentary phase adding to the corresponding divider. The phase adjustment module is aware of the instantaneous phase of the output divider, allowing the application of the phase adjustments to be performed at the desired point in the output clock waveform.

The phase adjustment module thus provides a mechanism for advancing or retarding the phase of a clock signal that is synchronized via the DPLL, without otherwise affecting the operation and performance of the controlling DPLL, and offers several advantages. It requires minimal interaction from the controller logic. The module's control input has no real-time deadline requirements for the controlling logic. A phase adjustment may be reduced to multiple smaller phase adjustment steps, each of a programmable maximum step size. A single phase adjustment step is instantaneously applied, and not subject to any PLL bandwidth time constants. No more than one phase adjustment step will be performed per output clock cycle, and the step can be configured to occur at precise moments of the output cycle (such as during the low or high portion of the output clock cycle, as desired by the application). Moreover, the phase adjustments are performed in a manner considered to be glitchless for a wide variety of applications and configurations.

The phase adjustment module reads the current phase of the output divider, and is capable of applying the requested phase adjustment in step-sizes no larger than the maximum allowed by the configuration. Moreover, with the knowledge of the output clock's instantaneous phase, a state machine is able to cadence the application of the phase steps such that the adjustment is only applied once per cycle, and only during the desired positive or negative phase of the output clock.

According to another aspect of the invention there is provided a method of performing glitchless phase adjustment in a clock generator comprising a phase locked loop including a controlled oscillator providing an output signal representing a phase value and at least one output module for generating one or more output clocks from said output signal, said method comprising receiving a requested phase adjustment; breaking said requested phase adjustments into smaller increments; and applying said increments to an output clock generated in said at least one output module one cycle at a time.

BRIEF DESCRIPTION OF THE DRAWINGS

The invention will now be described in more detail, by way of example only, with reference to the accompanying drawings, in which:—

DETAILED DESCRIPTION OF EMBODIMENTS OF THE INVENTION

Figure 1:
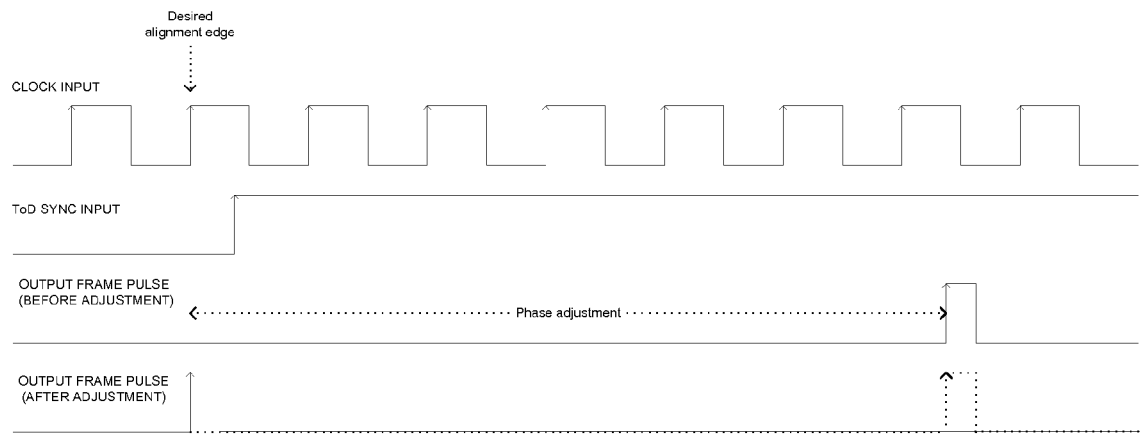
FIG. 1 is a timing diagram of the reference and sync inputs and the frame pulse output, before and after phase adjustment.
Figure 2:
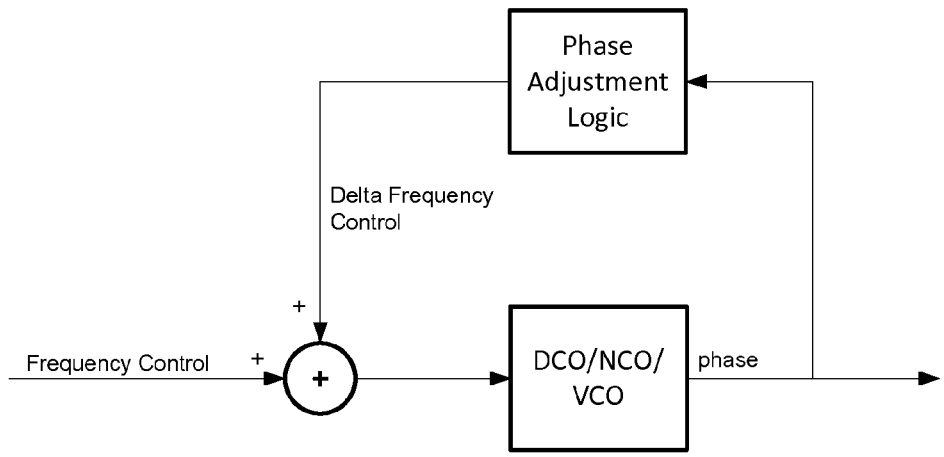
FIG. 2 is a block diagram of prior art using the NCO method of phase adjustment.
Figure 3:
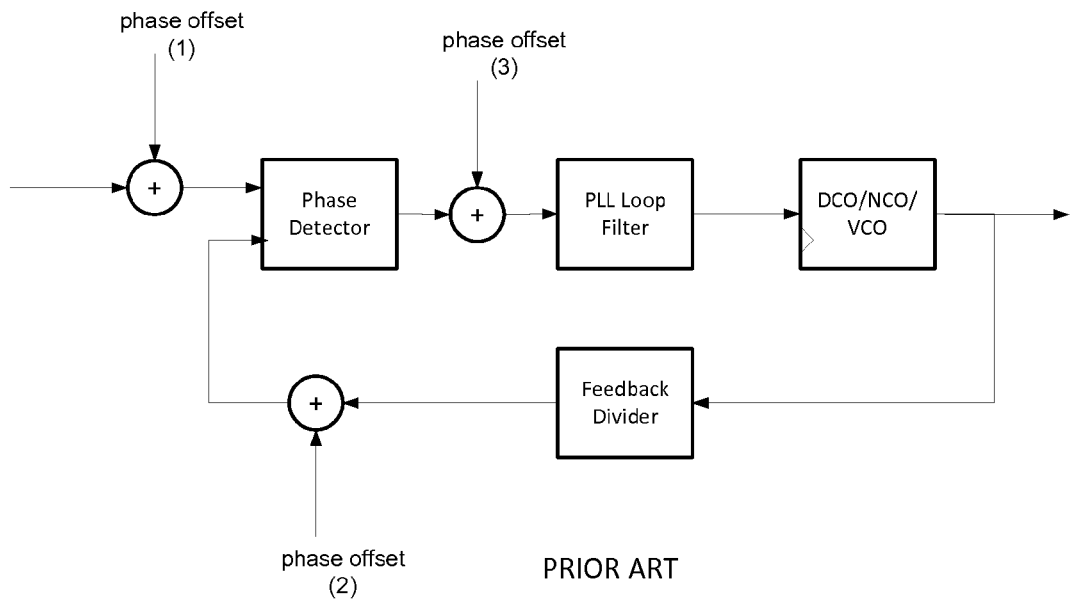
FIG. 3 is a block diagram of prior art applying a phase adjustment at the input side of the PLL.
Figure 4:
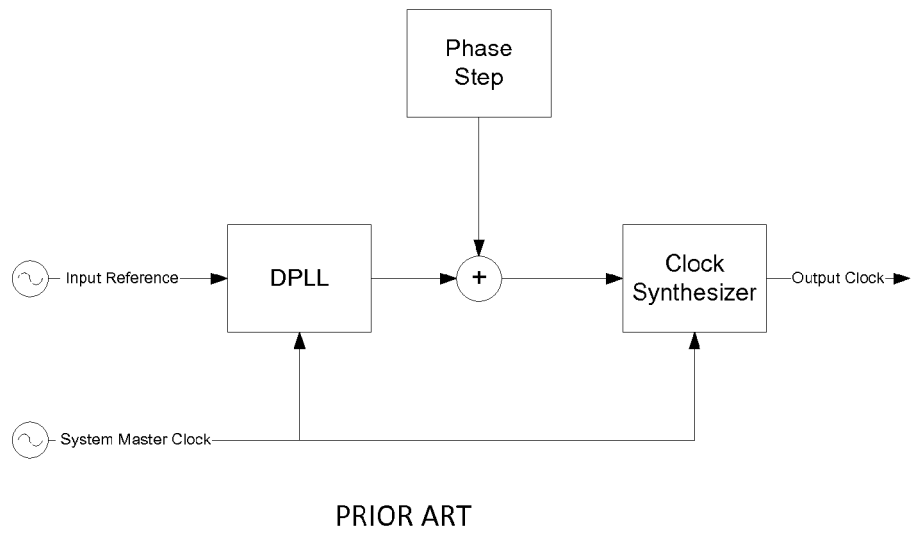
FIG. 4 is a block diagram of prior art applying a phase adjustment at the output side of the PLL.
Figure 5:
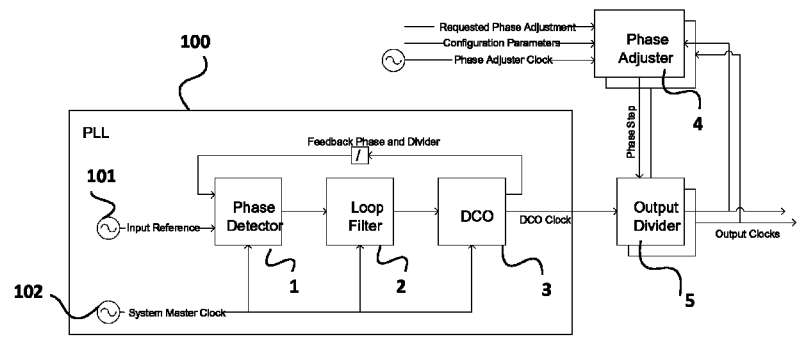
FIG. 5 is a top-level diagram of the PLL circuit with Phase Adjuster, according to the preferred embodiment.

One exemplary embodiment of the invention consists of a digital PLL (DPLL) generating a high frequency clock that is divided down to the desired output clocks by a set of output dividers, and a phase adjuster module that can precisely apply phase steps to the output dividers. Such an exemplary embodiment is shown in FIG. 5. It will be appreciated that the invention is applicable to other types of PLL including analog PLLs.

DPLL 100 comprises a phase detector 1, which continuously measures the average phase difference between the input reference clock 101 and the output of the digitally controlled oscillator (DCO) 3, which provides a feedback clock, using each reference clock edge. The measured phase error at the output of the phase detector 1 is passed to the loop filter 2.

The loop filter 2 filters the phase error generated at the output of the phase detector 1 and converts the phase error to a frequency offset for the DCO 3. The bandwidth of the PLL is controlled by the loop filter 2. Also, the locking behavior of the PLL with respect to the input reference 100 is mainly controlled by the loop filter parameters. Input 102 provides a master clock driving the system and may be derived from a crystal oscillator.

The DCO 3 generates a clock that is phase-locked and frequency-locked to the input reference clock 101. When the DPLL 100 is in holdover mode, which occurs when it is unable to lock on to the input reference clock 101, the frequency of the generated clock is controlled only by the last known good filter output value. The frequency offset value from the loop filter 2 is added to the nominal frequency. The phase of the clock generated by the DCO 3 is a result of integration of the sum of the nominal frequency and the frequency offset.

The phase adjustment module 4 applies a requested phase adjustment to the output clocks generated by the output module 5, which is in the form of divider that divides the output of the DCO 3 to generate the desired frequency. To minimize glitches, the requested phase adjustment is broken into smaller phase steps that are applied at timed intervals according to configuration parameters applied to the phase adjustment module 4. When no phase adjustment is applied (or between the timed intervals), the phase adjustment module 4 outputs a constant zero signal. The input clock for the phase adjustment module 4 can either be the DCO output clock or a divided down version of it.

The output divider 5 is used to generate all required the output clocks by dividing the clock generated by the DCO 3 summed with the phase adjustment from the phase adjustment module 4. The output of the DCO 3 is actually a phase value that includes an integer part and a fractional part. The output divider 5 also makes available the value of its instantaneous phase. This value provides the phase adjustment module 4 with information about the instantaneous phase position relative to the divided output clock cycle.

Figure 6:
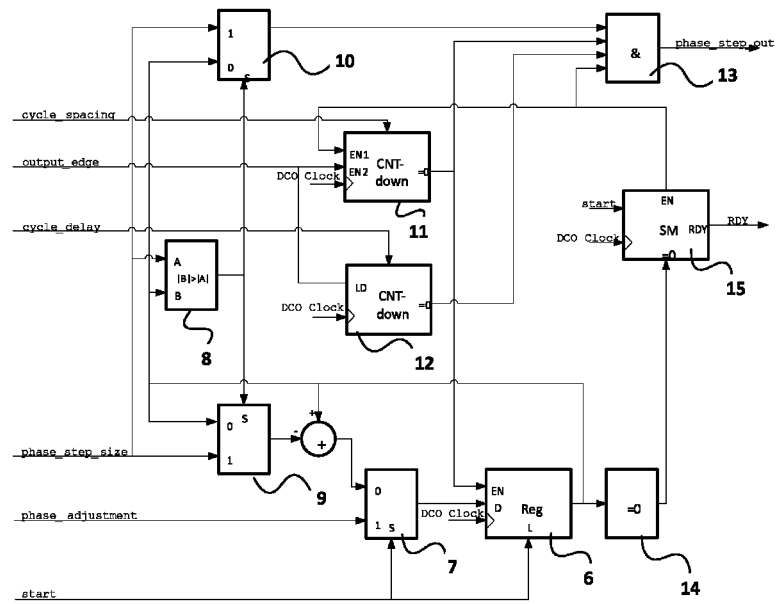
FIG. 6 is an internal block diagram of the Phase Adjuster component of the preferred embodiment.

In one embodiment, shown in FIG. 6, the phase adjustment module 4 is implemented with digital logic that runs at the same rate as the DCO Clock 3. In other words, the phase adjustment clock input is driven directly by the output clock of the DCO 3.

In this embodiment the phase adjustment module 4 has the following inputs:

phase_adjustment—this is the total Phase Adjustment requested by the controller.

start—a one DCO cycle wide pulse that initiates a phase adjustment phase_step_size—this is the size of the largest allowed phase movement per cycle_spacing interval cycle_spacing—this is how often (in output clock cycles) that a phase step (of size <=phase_step_size) will be applied. A value of one results in a phase step applied each output cycle. A value of two results in a phase step every-other output cycle (and so on).

cycle_delay—this indicates the delay (in DCO Clock cycles) from the start of the output cycle where the phase step should be applied. This allows the controller to specify whether the high portion or low portion of the clock signal should be extended (shortened) for a positive (negative) phase step.

output_edge—this signal is a one DCO Clock cycle wide pulse that indicates the start of the output clock cycle (the output of a rising or falling edge detector on the divider output clock).

The phase_adjustment and phase_step_size inputs are also in units of DCO clock cycles. The logic supports both positive (advancing the output clock) and negative (retarding the output clock) phase adjustment values.

In this embodiment register 6 is used to store the total phase adjustment that is yet to be processed. During active phase stepping, at the conclusion of each individual phase step, the register 6 is updated with a decremented version of itself, i.e. the value of a single phase step is subtracted from its current value.

The Mux 7 selects whether the initial or the decremented version of the phase adjustment is loaded into the register 6. When the start signal is asserted, the initial requested phase adjustment value (phase_adjustment) is loaded into the register 6. Otherwise, the Mux 7 selects the result of a subtraction, which will be loaded the next time the down-Counter 11 expires.

A comparator 8 detects residual phase. Unless the initial phase_adjustment value is an integer multiple of phase_step_size, then there will be some residual phase left over for the last phase step. When the comparator detects that the phase_step_size is greater than the residual phase, it selects via Mux 9 and Mux 10 the residual phase to be used during the last phase step iteration.

Mux 9 selects either phase_step_size or residual phase for the input to the register 6 subtraction operation. Mux 10 selects either phase_step_size or residual phase for the phase step output which will be latched by And-Logic module 13.

The down-counter 11 counts output clock cycles. The down-counter 11 is decremented when the State-Machine 15 asserts signal EN and a new output clock cycle begins as reported by the output_edge signal. The cycle_spacing value is then loaded into the counter 11 on the first assertion of output_edge following counter expiration. The cycle_spacing value determines the number of output clock cycles required between applications of the phase step.

The down-counter 12 determines where, in an output cycle, to apply a phase step. This counter expires at the same point in every output clock cycle, namely exactly a number of DCO Clock cycles equal to the variable cycle_delay after detecting the appearance of the output_edge signal.

The AND-Logic module 13 outputs the result of Mux 10 when the other three inputs are all non-zero. Otherwise, it outputs zero. Thus, when the state machine 15 indicates EN=1 and both down-counters 11 and 12 have expired, then a non-zero phase step will be summed into the output phase. The comparator 14 detects when there is no more phase to be stepped. The entire requested phase adjustment is complete when the register 10 reaches zero.

Figure 7:
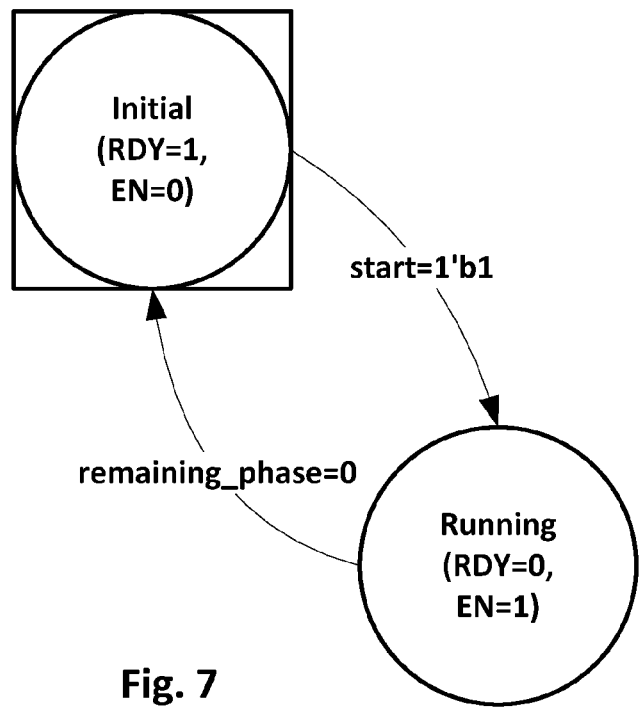
FIG. 7 is a diagram showing the states and state transitions of the State Machine component of the Phase Adjuster module.

The state machine 15 makes the phase adjustment module start at the correct moment and stop when ready. The state machine 15 is shown in FIG. 7.

The phase adjustment is realized in the output dividers 5, which are in the form of counters. Changing the output phase is equivalent to changing the start time of the output counter.

One possible implementation of the output counter is a down counter, although an alternative would be to use an up counter, which works in a similar manner.

Figure 8:
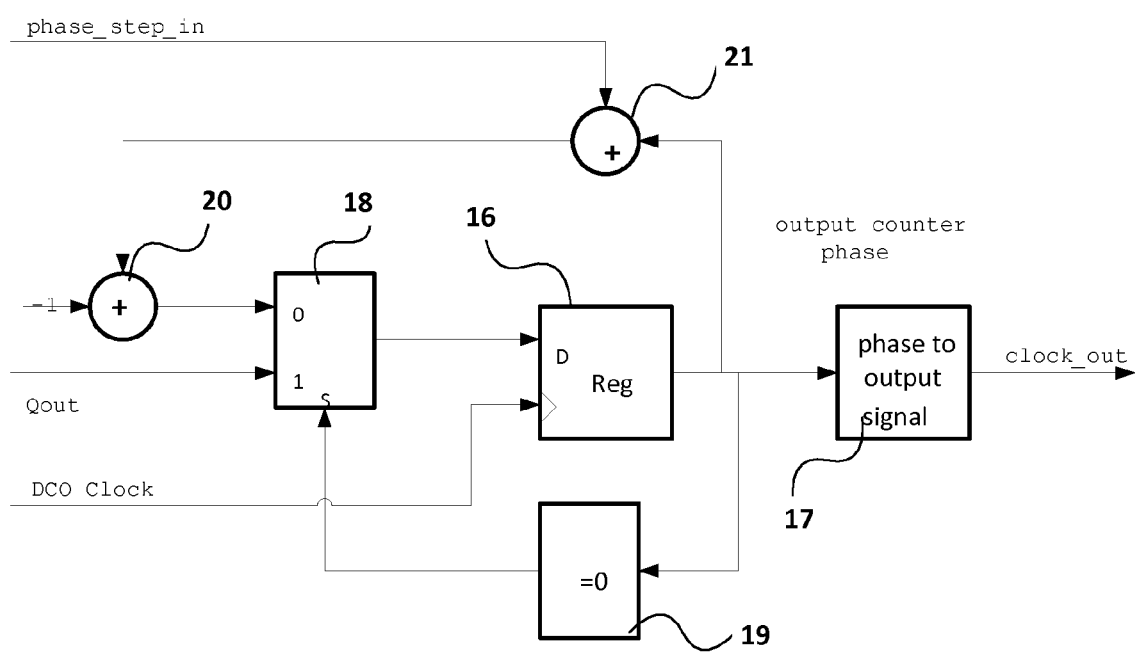
FIG. 8 is a diagram showing the Output Divider block implemented as a down counter with phase step summed into the counter's decrement path.

One implementation of a down counter is given in FIG. 8. A down counter can be built from a register 16, an adder 20, a multiplexer 18, and a zero detector 19. On each DCO clock cycle the value of the register is decremented by one and stored in register 16. The zero detector 19 detects when the contents of register 16 is zero. In that case multiplexer 18 will select the output count value Qout which will be stored the next clock cycle. Qout is the divider ratio number. The state of the counter (the contents of register 16) will be translated to an output value by the "phase-to-output signal" module 17. In general the output will be 1 when the value of the register 16 is higher than half the value of Qout and will be 0 otherwise. In this architecture the phase step correction is done by adding the phase step to the contents of the register 16 using adder 21.

Figure 9:
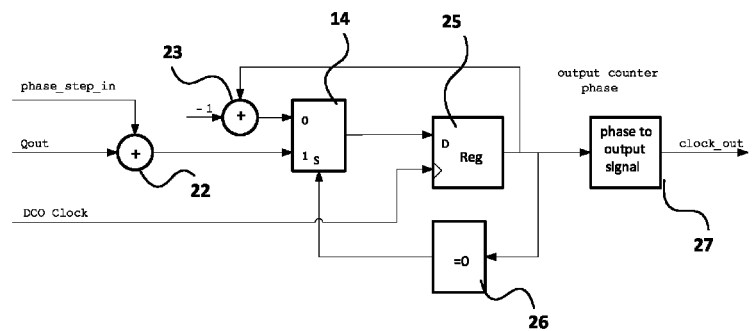
FIG. 9 is a diagram showing the Output Divider block implemented as a down counter with phase step summed into the output divider ratio value (the counter's re-load value).

Because the speed of the clock used for down counters is in general very high, this embodiment is not always feasible. The same result can be achieved however using a different approach shown in FIG. 9.

The down counter is constructed with a register 25, an adder 23, a multiplexer 24, a zero detector 26 and a phase-to-output value signal block 27. But here the phase adjustment is achieved by modifying the output division ratio using adder 22. In this case phase_step_in is a positive or negative number that is added to it representing the phase offset in cycles of the DCO clock. A potential problem with this implementation is that where the correction is executed is not known, whether during the high time or the low time of the output clock. This potential problem is not present in the next embodiment shown in FIG. 10.

Figure 10:
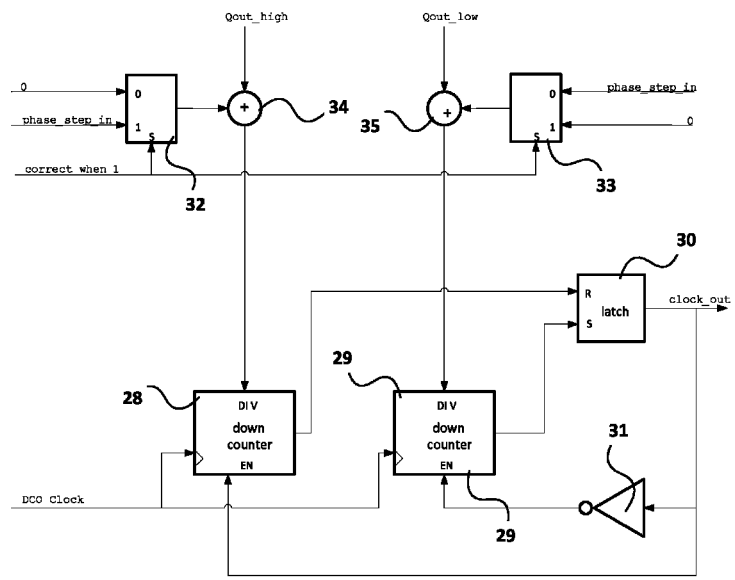
FIG. 10 is a diagram showing the Output Divider block implemented as pair of down counters, one for the high and one for the low portions of the output cycle.

In FIG. 10, the output counter has full control over the high and low periods of the output clock. This output counter consists of two down counters 28 and 29, which are alternately active. Upon reaching their maximum count they set and reset SR-latch 30 and thereof start the other counter. The period that the output is high or low is set by the inputs Qout_high and Qout_low.

It is now possible to control the high and low period of the output clock. Thus it is also possible to select whether the phase step is applied during the high or the low period. This is used by setting signal correct_when_1 to 1 for phase stepping during a 1 (high period) and setting it to 0 (low period) for phase correction during a zero. This signal controls the multiplexers 32 and 33. The output of the multiplexers is either 0 or phase_step_in and is added to the signal Qout_high and Qout_low using adders 34 and 35.

Embodiments of the invention thus provide a method for splitting a large phase adjustment into multiple smaller phase steps applied over multiple output clocks in system consisting of a PLL and one or more output dividers, and precisely timing the application of the phase steps such that the phase adjustment can be applied to the high or the low portion of the output cycle, thereby accomplishing a glitch-less phase step.

The combination of a single PLL with multiple pairs of phase adjuster modules and output dividers provides the ability to simultaneously and synchronously adjust the phase of multiple output clocks without affecting the frequency lock provided by the PLL, and to selectively phase adjust one PLL output without affecting the other PLL outputs.

The system is independent of architecture of the PLL. The architectures expected to work include analog PLLs, digital PLLs, and Software PLLs (SPLL). The phase adjuster module when used with a DPLL or SPLL is capable of being run asynchronously with the PLL's master clock. The phase adjuster module when used with an SPLL and a digital clock divider can be implemented in software that runs at the digital clock divider update rate.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor. In particular, it will be appreciated that if the phase adjustment modules and output dividers are implemented in software, each module can represent an instance of the relevant program object.

We claim:

1. A clock generator with glitchless phase adjustment, comprising:
    a phase locked loop including a controlled oscillator providing an output representing a phase value;
    at least one output module for generating one or more output clocks from said output; and
    at least one phase adjustment module for adding a requested phase adjustment to an output clock, said at least one phase adjustment module being configured to break said requested phase adjustment into smaller increments and apply said increments to an output clock generated in said at least one output module one cycle at a time.

2. A clock generator as claimed in claim 1, wherein said at least one phase adjustment module is responsive to a phase input from said at least one output module to apply said increments to said output modules at a predetermined instant in an output cycle.

3. A clock generator as claimed in claim 1, wherein said predetermined instant occurs at a selected instant during a high or low portion of the output cycle.

4. A clock generator as claimed in claim 2, wherein said at least one phase adjustment module comprises a register storing a current phase adjustment value to be applied to said at least one output module, a logic module configured to apply, if said current phase adjustment value is not zero, a predetermined phase increment, or a residual phase increment if said current phase adjustment value is less than said predetermined phase increment, to said at least one output module at said predetermined instant, a subtractor for subtracting said applied phase increment, or said residual phase increment, from said register, when a said increment is applied to said at least one output divider.

5. A clock generator as claimed in claim 4, wherein at least one said phase adjustment module further comprises a counter responsive to signal indicative of an edge of an output clock to provide a control signal to said logic module to determine where in an output clock cycle said predetermined phase increment or residual phase increment is applied to said at least one output module.

6. A clock generator as claimed in claim 5, wherein said at least one phase adjustment module further comprises a second counter responsive to said signal indicative of an edge of an output clock to count output clock cycles and determine the number of output clock cycles between each application of the phase increment.

7. A clock generator as claimed in claim 6, wherein said at least one phase adjustment module further comprises a state machine responsive to a start input initiating phase adjustment at an output of the controlled oscillator to start and stop the application of the requested phase adjustment.

8. A clock generator as claimed in claim 1, wherein said at least one output module acts as a divider and comprises a register storing a count value that is changed on each cycle of said output signal from the controlled oscillator, and adder for adding a said phase increment to the said register, and phase-to-output signal module for generating said output clock from the output of said register.

9. A clock generator as claimed in claim 8, wherein the count value of said register is decremented on each clock cycle.

10. A clock generator as claimed in claim 1, wherein said at least one output module acts as a divider and comprises a register storing a count value that is changed on each cycle of said output signal from the controlled oscillator, and adder for adding a said phase increment to said count value to change the division ratio of said output module, and phase-to-output signal module for generating said output clock from the output of said register.

11. A clock generator as claimed in claim 1, wherein said at least one output module comprises two counters corresponding to high and low periods of the output clock, and respective adders for selectively adding phase increments to one of said counters.

12. A method of performing glitchless phase adjustment in a clock generator comprising a phase locked loop including a controlled oscillator providing an output signal representing a phase value and at least one output module for generating one or more output clocks from said output signal, said method comprising:
    receiving a requested phase adjustment;
    breaking said requested phase adjustments into smaller increments; and
    applying said increments to an output clock generated in said at least one output module one cycle at a time.

13. A method as claimed in claim 12, wherein increments are applied to said output clock at a predetermined instant in an output cycle.

14. A clock generator as claimed in claim 12, wherein said predetermined instant occurs at a selected instant during a high or low portion of the output cycle.

15. A method as claimed in claim 13, further comprising storing a current phase adjustment value to be applied to said at least one output module, applying, if said current phase adjustment value is not zero, a predetermined phase increment, or a residual phase increment if said current phase adjustment value is less than said predetermined phase increment, to said output clock at said predetermined instant, subtracting said applied phase increment, or said residual phase increment, from the current phase adjustment value, when a said increment is applied to said at least one output clock.

16. A method as claimed in claim 15, further comprising counting from an edge of an output clock to provide a control signal to said logic module to determine where in an output clock cycle said predetermined phase increment or residual phase increment is applied to the output clock.

17. A method as claimed in claim 16, further comprising output clock determine the number of output clock cycles between each application of the phase increment.

18. A method as claimed in claim 17, further comprising providing a state machine responsive to a start input initiating phase adjustment at an output of the controlled oscillator to start and stop the application of the requested phase adjustment.

19. A method as claimed in claim 12, further comprising storing a count value that is decremented on each cycle of said output from the controlled oscillator, and adding a said phase increment to the count value, generating said output clock based on said count value.

20. A method as claimed in claim 12, further comprising maintaining two count values corresponding to high and low periods of the output clock, and selectively adding phase increments to one of said counters.

* * * * *